United States Patent
Edelstein et al.

(10) Patent No.: US 7,276,787 B2
(45) Date of Patent: Oct. 2, 2007

(54) SILICON CHIP CARRIER WITH CONDUCTIVE THROUGH-VIAS AND METHOD FOR FABRICATING SAME

(75) Inventors: Daniel Charles Edelstein, White Plains, NY (US); Paul Stephen Andry, Mohegan Lake, NY (US); Leena Paivikki Buchwalter, Hopewell Junction, NY (US); Jon Alfred Casey, Poughkeepsie, NY (US); Sherif A. Goma, Hawthorne, NY (US); Raymond R. Horton, Dover Plains, NY (US); Gareth Geoffrey Hougham, Ossining, NY (US); Michael Wayne Lane, Cortlandt Manor, NY (US); Xiao Hu Liu, Croton on Hudson, NY (US); Chirag Suryakant Patel, Peekskill, NY (US); Edmund Juris Sprogis, Underhill, VT (US); Michelle Leigh Steen, Danbury, CT (US); Brian Richard Sundlof, Beacon, NY (US); Cornelia K. Tsang, Mohegan Lake, NY (US); George Frederick Walker, New York, NY (US)

(73) Assignee: International Business Machines Corporation, Armonk, NY (US)

(\*) Notice: Subject to any disclaimer, the term of this patent is extended or adjusted under 35 U.S.C. 154(b) by 207 days.

(21) Appl. No.: 10/729,254

(22) Filed: Dec. 5, 2003

(65) Prior Publication Data

US 2005/0121768 A1 Jun. 9, 2005

(51) Int. Cl.
*H01L 23/48* (2006.01)
*H01L 23/498* (2006.01)
*H01L 21/4763* (2006.01)
*H01L 29/40* (2006.01)

*H01L 23/52* (2006.01)

(52) U.S. Cl. .............................. 257/698; 257/E23.067; 257/E23.075; 257/E23.011; 257/E25.013; 257/E21.597; 257/E23.006; 257/E23.172; 257/E23.174; 257/774; 257/773; 257/702; 257/680; 257/700; 257/758

(58) Field of Classification Search ........ 257/E23.067, 257/E23.075, E21.597, E23.011, E25.013, 257/E25.023, E23.006, E23.172, E23.174, 257/E23.004, E27.046, E23.007, 698, 702, 257/774, 680, 773, 700, 701, 758, 489, 329, 257/339, 302, 328
See application file for complete search history.

(56) References Cited

U.S. PATENT DOCUMENTS 6,072,190 A \* 6/2000 Watanabe et al. ............. 257/48

(Continued)

*Primary Examiner*—Alexander Oscar Williams
(74) *Attorney, Agent, or Firm*—Robert M. Trepp; Ann Vachon Dougherty

(57) ABSTRACT

A carrier structure and method for fabricating a carrier structure with through-vias each having a conductive structure with an effective coefficient of thermal expansion which is less than or closely matched to that of the substrate, and having an effective elastic modulus value which is less than or closely matches that of the substrate. The conductive structure may include concentric via fill areas having differing materials disposed concentrically therein, a core of the substrate material surrounded by an annular ring of conductive material, a core of CTE-matched non-conductive material surrounded by an annular ring of conductive material, a conductive via having an inner void with low CTE, or a full fill of a conductive composite material such as a metal-ceramic paste which has been sintered or fused.

8 Claims, 13 Drawing Sheets

U.S. PATENT DOCUMENTS

| | | |
|---|---|---|
| 6,358,762 B1 * | 3/2002 | Kohno et al. .................. 438/17 |
| 6,693,358 B2 * | 2/2004 | Yamada et al. ............. 257/774 |
| 6,700,175 B1 * | 3/2004 | Kodama et al. ............ 257/489 |
| 6,780,311 B1 * | 8/2004 | Haley ......................... 210/162 |
| 6,809,421 B1 * | 10/2004 | Hayasaka et al. ........... 257/777 |
| 6,933,205 B2 * | 8/2005 | Matsuo et al. .............. 438/406 |
| 2006/0001174 A1 * | 1/2006 | Matsui ....................... 257/774 |

* cited by examiner

SILICON CHIP CARRIER WITH CONDUCTIVE THROUGH-VIAS AND METHOD FOR FABRICATING SAME

FIELD OF THE INVENTION

The invention relates generally to a carrier for mounting and packaging multiple integrated circuit chips; and, more particularly, to a self-supporting semiconductor or insulator carrier substrate with conductive through-vias.

BACKGROUND OF THE INVENTION

A carrier for integrated circuit devices is typically fabricated of semiconductor, glass, or glass-ceramic material as a freestanding substrate, chip or wafer having conductive through-vias. The through-vias are exposed on the top and underside of the carrier and are insulated from each other. Multiple levels of carrier material with metallic or semi-metallic vias are often required to obtain the necessary conductive paths between chips and other devices mounted with respect to the carrier. The carrier having through-vias provides chip input/output terminals (I/O), with the chips typically mounted in the "flip chip" manner, and other device I/O through the carrier from the surface at which the chip or device is mounted to the other side of the carrier, which may include a next level of packaging, a board, or additional flip-chips mounted on that side of the carrier.

FIG. 1 provides a representative illustration of a carrier in accordance with this invention. Carrier 102 comprises a layer 104 of insulative or semiconductive material, for example silicon, fused silica ("glass", "quartz"), ceramic, or another semiconductor or insulator. The carrier 102 has multiple through-vias, shown as 105 representatively, which extend from the upper or top surface of the carrier layer 104 to the bottom surface of the carrier layer 104. The through-vias are filled with a metallic or semi-metallic conductive via material, shown as conductor 115, to provide conductive paths through the carrier. Solder bumps, C4s, or the like, shown as 114, are disposed at the bottom surface of carrier layer 104 in electrical contact with the conductive via material 115 in order to join the carrier to a next level. At the upper surface of carrier layer 104, the conductive material 115 in the through-vias may be placed in electrical contact with additional multilevel wiring, integrated circuits or associated devices, optical or optoelectronic elements, microelectromechanical elements, etc. disposed in layers 106 which are, in turn, connected to the chip connectors, shown as microjoints 125, of chip 120. Semiconductor devices may also be embedded in the substrate and electrically incorporated into the aforementioned integrated circuits. Should additional multilevel wiring not be needed, the microjoints of chip 120 can be bonded directly to the conductive via material 115.

Problems have arisen in carriers of the prior art due to limitations in materials, deposition methods, control of dimensional tolerances, and mechanical stresses encountered during processing of the materials. Traditional substrate thicknesses are in the range of 0.5 mm to 20 mm with through-via aspect ratios in the range of 1:1 to 2:1. Through-vias may be tapered or vertical as dictated by the forming technology. For instance, vias formed by a punch technique display a breakout region and laser vias can be tapered depending upon the aspect ratio. Typical pitches may be 225 µm for glass ceramic substrates at the present, and 150 µm for ceramic substrates. Depending upon the desired via density, given the number of chips or other devices to be joined to the carrier and the number of desired bonding sites, the via diameters would accordingly range from 25 to 300 µm.

There is a need to miniaturize such carriers to accommodate single or multiple flip-chips and micro-components with I/O densities of from 1,000 to 10,000 per $cm^2$, with overall physical dimensions being in the single cm range for length and width and in the range of a single µm to a few 100 µms in thickness. For high speed and low power, the through-vias and associated connections must present series resistances lower than several 100 mΩs to several tens of mΩs, or else signal risetimes will be degraded. This in turn specifies that through-vias filled with typical conductive materials be of a height in the range of a single µm to several hundred µms with diameters of several 10's to ~100 µm.

Filling such high aspect ratio vias is challenging. A popular technique for filling blind vias or through-vias of micro-scale diameters is electroplating of Cu. However, the hydrodynamics, the ionic concentrations, and the diffusivities limit the filling of deep blind holes. Authors Tomisaka et al. (ECTC 2002) did extensive plating optimization and were still not able to eliminate voids in vias of only 70 µm deep. Methods for filling large blind holes which are to be opened later break down or become impractical at such dimensions. The U.S. Pat. No. 5,998,292 of Black, et al details a method for creating insulated conductive through-holes in a semiconductor wafer for 3-dimensional wafer joining. Black's method involves etching so-called blind holes only partially through the semiconductor substrate, insulating the holes' sidewalls, filling the insulated holes with metal selected from tungsten, chromium, copper, aluminum, nickel, indium, gold, and mixtures or alloys thereof, planarizing the top surface and removing excess metal, and then grinding away the bottom semiconductor material to expose the bottom of the filled vias (i.e., to open the blind holes). U.S. Pat. Nos. 5,646,067 and 5,814,889 and 5,618,752 of Gaul use the Black approach applied to a silicon carrier layer with tungsten or polysilicon through vias. Chiu et al. (U.S. Pat. No. 6,593,644) describe a similar process to create a Si-based chip carrier, with through-vias filled by Cu, Ni, or Al. The Black method provides adequate fill of the through-vias (for some of the listed materials); however, given the materials used, the resulting structure will experience the mechanical failures described below with reference to Table 1. Gaul utilizes materials that are more closely thermally matched, namely W and poly-Si, but would not have practical deposition methods for multi-10's of µm and would have vastly differing values for modulus. It is also to be noted that incorporation of embedded components into present carriers is difficult due to processing limitations, such as high temperature sintering conditions for ceramic carriers, as well as limitations with embedded component material systems.

At the above-stated diameters, most metals which are commonly used for integrated circuit interconnect vias generate unacceptable stress levels on the carrier layer material (e.g., Si or glass) due to thermal expansion mismatch. In addition, the metal structures exhibit top surface extrusions, ruptures, or expansions during and after typical thermal cycling. For carrier substrates and integrated devices that are comprised of brittle materials, such as semiconductors, glass, or ceramics, the risk of mechanical failure by brittle fracture is significant given the thermal expansion mismatches and the fragility of the carrier materials. In addition to brittle fracture, interfacial delamination is likely when employing standard materials and combinations of materials at the stated dimensions. Table 1 provides a listing of commonly used materials, namely silicon for substrates, and copper, tungsten, and nickel for the metal, and their mechanical properties.

| MATERIAL | YOUNG'S MODULUS (GPa) | POISSON RATIO | CTE (ppm/° C.) |
|---|---|---|---|
| Silicon | 170 | 0.28 | 3 |
| doped polysilicon | 170 | 0.28 | 2 |
| Copper | 130 | 0.34 | 16.5 |
| Tungsten | 411 | 0.28 | 4.5 |
| Nickel | 200 | 0.31 | 13.4 |

Of the metals commonly used for substrate metallization, only tungsten (W), with a CTE of ~5 ppm/° C. approaches the CTE of silicon (Si). However, the modulus of W is so high (>400 GPa) compared to that of silicon (~170 GPa) that brittle fracture of the Si and/or delamination of via sidewalls are likely, given the finite but small thermal expansion mismatch. Like W, the typical processes used to grow or deposit poly-Si are only practical for thicknesses up to ~1 or several single µm, and often are limited to deposition temperatures above the maximum temperatures that can be tolerated by integrated circuit components or wiring on the substrate above (if these are to be fabricated prior to filling the through-vias).

Three potential problems associated with large CTE mismatches between vias and the Si substrate include delamination at the via sidewalls (resulting in so-called "rattling vias" that exhibit compromised conductivity and mechanical stability), cracking of the Si substrate between vias, and piston-like ruptures of any overlying or underlying structures or thin films in contact with the top and bottom surfaces of the vias. The following reference discusses via cracking issues: "Fiber-End Cracking in Brittle-Matrix Composites: A Model Study", J. A. Casey, D. R. Clarke and Y. Fu, in Metal-Ceramic Interfaces, Proceedings of an International Workshop, ACTA Met, 1990.

The vertical extrusion due to sidewall stresses is determined by the thermal expansion mismatch, the modulus, and the Poisson ratio. The forces resulting from the extrusion and acting on the overlying or underlying structures or thin films increase with the modulus of the through-vias. The piston-like failures can be avoided by minimizing the thermal expansion mismatch, the Poisson ratio, and the modulus of the through-vias. If a conductive material has a CTE which is exactly the same as that of the substrate materials, then the modulus and Poisson ratio of the conductive material would not be an issue.

What is needed, therefore, and what is an object of the present invention is to provide a carrier structure which can be fabricated at the desired dimensions and which can withstand thermal cycling experienced during production, joining processing, and use.

Another object of the present invention is to provide a through-via structure including conductive material having a coefficient of thermal expansion which closely matches the substrate material, a reduced modulus and a reduced Poisson ratio in order to minimize the negative effects of thermal mismatch.

Yet another object of the present invention is to provide a through-via structure which includes multiple differing materials having different coefficients of thermal expansion, to result in a through-via having an effective coefficient of thermal expansion which most closely matches that of the substrate, to minimize the negative effects of thermal mismatch.

Another object of the invention is to provide a through-via structure which includes multiple differing materials having different coefficients of thermal expansion, to result in a through-via having an effective coefficient of thermal expansion which closely matches that of the substrate material and an effective modulus which most closely matches that of the substrate, or which is reduced to be less than that of the substrate, to reduce mechanical stresses encountered in processing and use.

SUMMARY OF THE INVENTION

The foregoing and other objects are realized by the present invention which provides a carrier structure and method for fabricating a carrier structure having through-vias which are filled with a composite conductive material having a coefficient of thermal expansion which closely matches that of the substrate and having a modulus value which matches or is less than that of the substrate. The composite conductive material may be a conducting metal, a conducting metal ceramic, a conducting mixture of metals and ceramics, or a metal with a sealed void.

One embodiment of the invention includes a structure and method for fabricating a carrier structure having through-vias comprising concentric via fill areas each having differing materials disposed therein, wherein the via structure has an effective thermal coefficient of expansion and an effective modulus which are matched more closely to that of the carrier substrate material.

In another embodiment, each via structure is patterned as a annulus about a post "via" of the carrier material. The annulus is patterned to a depth which is the same as the desired length of the via and is less than the overall depth of the carrier layer. Upon filling the annulus with the desired conductive material, the conductor-lined, carrier-material-filled via is then exposed by polishing back the surface of the carrier having the base of the post to expose the conductive ring.

BRIEF DESCRIPTION OF THE DRAWINGS

The invention will now be described in greater detail with specific reference to the appended drawings wherein.

DETAILED DESCRIPTION OF THE INVENTION

The invention addresses the shortcomings of the prior art by providing metal-ceramic materials, or multiple materials in through-vias, wherein the materials are chosen to reduce the negative effects of thermal mismatch by achieving an effective thermal expansion coefficient and an effective modulus which more closely matches those of the carrier substrate material. For a carrier substrate of silicon, which has a CTE of 3 ppm/° C. and an elastic modulus of 170 GPa, it is preferable to fill the through-via with a material or a combination of materials that yield an effective CTE of less than 8 ppm/° C. and an effective elastic modulus of less than or equal to 170 GPa. FIGS. 2A, 2B, 2C, and 2D are perspective views of carriers having through-vias with matched mechanical properties formed in accordance with different embodiments of the present invention.

Figure 1:
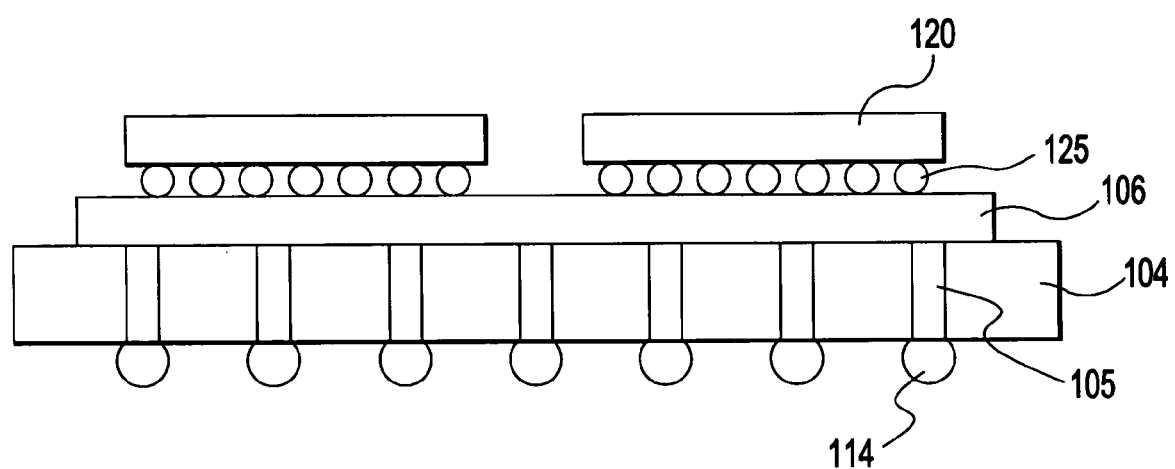
FIG. 1 is a side view of the carrier of the instant invention.
Figure 2A:
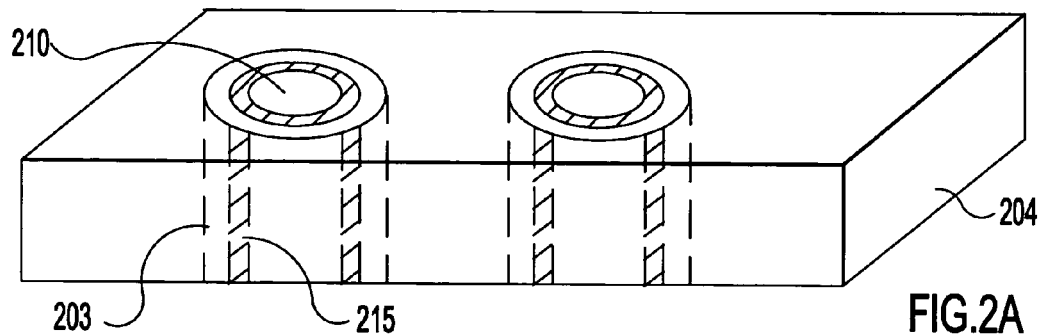
FIGS. 2A, 2B, 2C, and 2D are perspective views of carriers having through-vias with matched mechanical properties formed in accordance with different embodiments of the present invention.

FIG. 2A shows a side view of one carrier embodiment 200 of the invention wherein an annular ring 215 of a first via material, comprising a desired conductor, is disposed about the periphery of the via hole in the carrier substrate material 204, lining the cylinder, with the inner volume of the lined cylinder being filled with a second via material 210. The second via material is chosen to have a CTE which is close to the CTE of the carrier substrate material 204, so that undesirable effects of thermal mismatch will be minimized while still realizing the desired conductive properties in the through-via. An additional insulating ring 203 or liner may be disposed between the annular ring 215 and the carrier substrate material 204 to act as an additional insulator or diffusion barrier or both.

Figure 3:
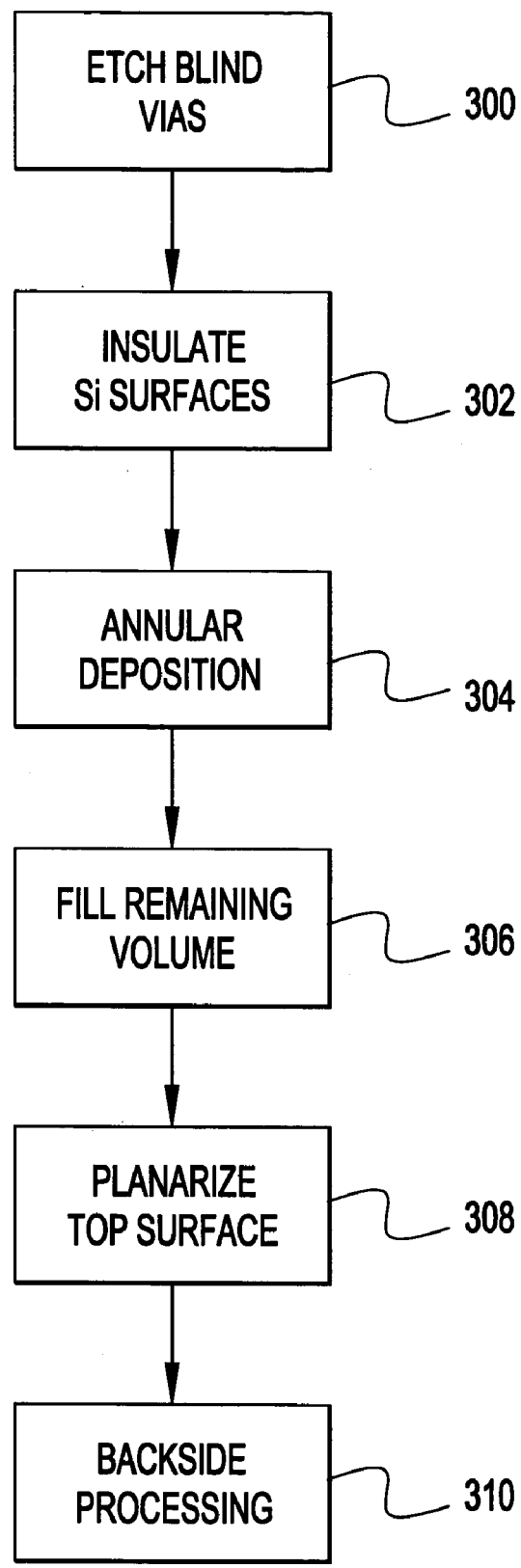
FIG. 3 is a flow chart of a representative process flow for fabricating a carrier with through-vias, as shown in FIG. 2A, in accordance with one embodiment of the present invention.

FIG. 3 is a flow chart of a representative process flow for fabricating a carrier with through-vias, as shown in FIG. 2A, in accordance with one embodiment of the present invention. The carrier substrate, made of a semiconductor or insulative material, silicon for example, is etched at step 300 to form blind vias. Blind vias are defined as vias which extend to a desired depth into the carrier substrate layer, which desired depth is less than the thickness or depth of the initial carrier substrate. The desired depth is defined as the depth of the cylindrical through-vias which will result from the process, also defined for most resulting structures as the desired overall thickness of the end-product carrier substrate with through-vias. The blind vias are etched into the silicon, or other carrier material, at step 300, using standard etching techniques known in the art. A suitable deep etch method is described in co-pending patent application Ser. No. _____, entitled "Deep Filled Vias", which was filed on Aug. 13, 2003, and is assigned to the present assignee, the teachings of which are incorporated herein by reference. In the presently preferred embodiment, the substrate comprises silicon and the pattern transfer can be accomplished using silicon etching by fluorine radicals generated in a plasma, as is known in the art. Deep silicon structures can be patterned using commercially-available, deep reactive ion etch (RIE) systems such as the A601E, available from Alcatel. The deep RIE dry etching method uses time-multiplexed deep etching (TMDE), a variation of sidewall passivation, wherein etching and deposition cycles are performed sequentially. During the deposition step, sidewalls are passivated by a polymer deposited from a plasma, formed from the deposition precursor. During the subsequent etching cycle, both the polymer and the silicon are preferentially etched from the bottom of the trench by ion bombardment. By switching between etching and deposition cycles, deep, anisotropic structures having vertical sidewalls can be realized with very high etching rates in silicon substrates. A backside oxide or metal layer may optionally be used as a stopping layer for the deep Si etch. If a semiconductor or other conductive substrate is used, the exposed surfaces of the cylindrical blind vias must then be insulated at step 302 to avoid electrical grounding, shorting, or crosstalk through the substrate of signals that will be carried by the conductive through-vias.

Insulation of the via sidewalls may be achieved through any number of standards techniques including, but not limited to, thermal oxidation in a tube furnace in an oxygen or steam environment at between 900° C. and 1100° C., low-pressure chemical vapor deposition (LPCVD) using TEOS at temperatures between 700° C. and 900° C., or plasma-enhanced chemical vapor deposition (PECVD) using silane or TEOS and oxygen or nitrous oxide, at temperatures between 300° C. and 600° C. Nitrides may be deposited using silane, ammonia, and nitrogen precursors. The time is determined by the desired oxide or nitride thickness, such as 0.5-2.0 µm. Oxide, nitride, or bilayers of the two materials are all used to insulate the exposed sidewalls and floor of the blind vias. For insulating substrates such as glass this step may not be necessary; however, a layer of an insulating material such as $Si_3N_4$ may still be desired to act as a diffusion barrier.

Thereafter, at step 304, annular deposition is conducted to form an annular ring of the desired conductor along the exposed insulated surfaces of the blind via. The annular deposition may consist of a PVD barrier layer, a seed layer, and a plated metal, for example, PVD TaN/Ta/Cu plus plated Cu. The PVD barrier layer aids in adhesion of the filling metal, as well as protecting it from corrosion or thermal diffusion into the outlying carrier substrate material. As noted above, it is preferable not to fill the entire via with the desired metal, since unacceptable thermal mismatch will result in breakage or delamination. Therefore, a controlled deposition is conducted to result in a thin annular ring of the conductive material.

At step 306, the remaining volume of the cylindrical blind via is filled with a second via material, which is either conducting or insulating, comprising material such as poly-Si, $SiO_2$, $Si_3N_4$, CVD-W, an inorganic oxide (e.g., glass, ceramic or glass ceramic compounds), a metal ceramic compound such as Cu-cordierite, or other suitable materials having CTE in the range of ~0 to ~5 ppm/° C., wherein the second via material has a thermal coefficient of expansion which matches or more closely approximates the CTE of the carrier substrate material (e.g., Si). In the example of Cu fill in a 100 μm diameter Si through-via, it has been calculated that a Cu plating thickness equal to 1/10 of the via diameter and filled with SiO2 will lead to the desired thermal and conductive properties.

Fill methods may include PECVD, PVD, plating, spin-on, sol-gel, bladder fill, or squeegee application with doctor blade. Some materials such as spin-on, sol-gel, and pastes may require a subsequent thermal cure and sinter. For example, for a Cu/Cordierite paste the deposition method used is preferably a vacuum assisted infiltration technique. A carrier with through-vias is placed within a chamber and a mechanical vacuum is drawn. The Cu/Cordierite paste is introduced and a squeegee or doctor blade is used to extrude the paste into the evacuated via holes. A preferred process incorporates screening from a pressurized nozzle under vacuum to achieve voidless fill at room temperature. The filling step is followed by a drying bakeout step and then removal of residual paste from the top surface. Thereafter a multistep sintering process is conducted, first under steam (400° C. to 650° C.) to burn out any organics from the paste, and then is followed by a higher temperature (650° C. to 800° C.) sintering step under forming gas to reduce any oxide in the metal system and assure good interlinking of the Cu particles.

After the filling of the remaining volume has been completed, the structure is planarized back to the top surface of the carrier substrate at step 308 to remove any materials deposited thereon. IC circuits and components may be fabricated on the top surface at some point, with care being taken to make electrical contact with the conductive annulus of the through-via. It may additionally be desirable to cap the second via vill material as detailed below with reference to FIGS. 12A through 12C. Finally, the bottom surface of the structure is subjected to a grinding and polishing step at 310 to expose the conductive annular ring material and second via fill material, resulting in the structure of FIG. 2A at the desired thickness for the end product carrier substrate with through-vias.

Figure 4A:
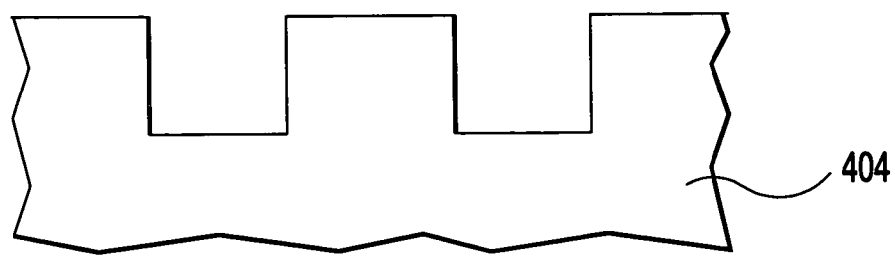
FIGS. 4A through 4K illustrate the structures obtained at each step of processing a carrier with through-vias in accordance with the process flow of FIG. 3 with further backside processing.
Figure 4B:
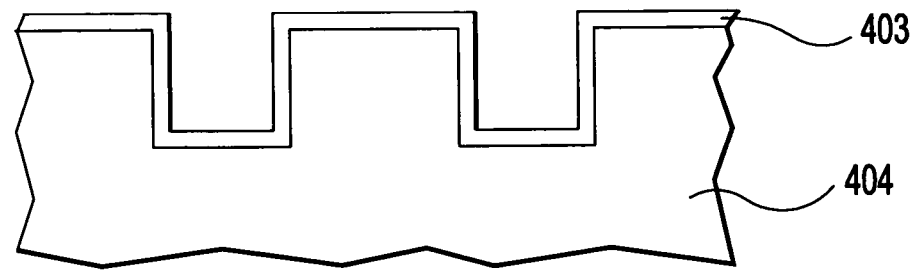
Figure 4C:
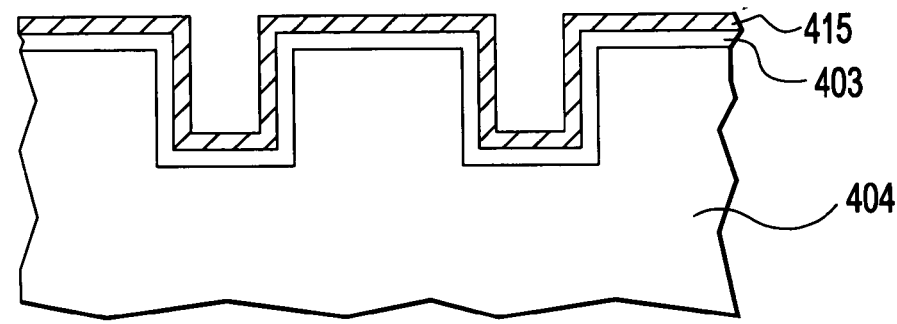
Figure 4D:
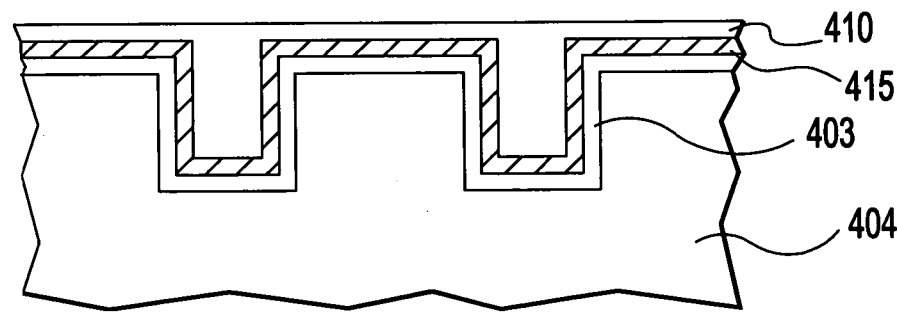
Figure 4E:
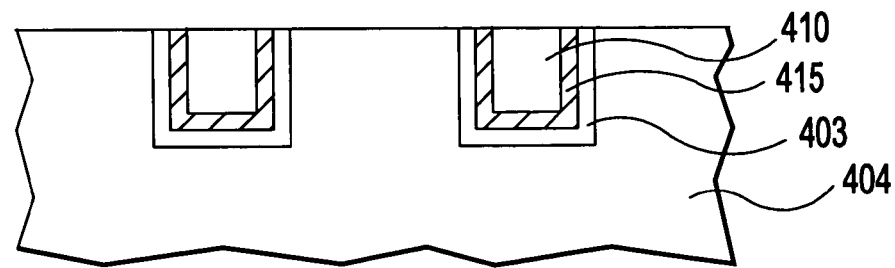
Figure 4F:
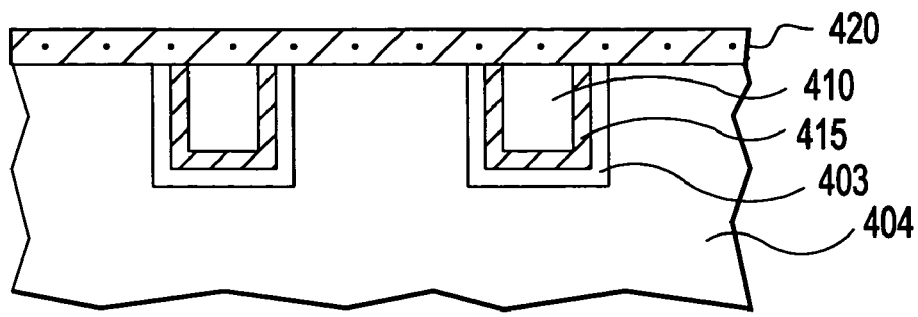
Figure 4G:
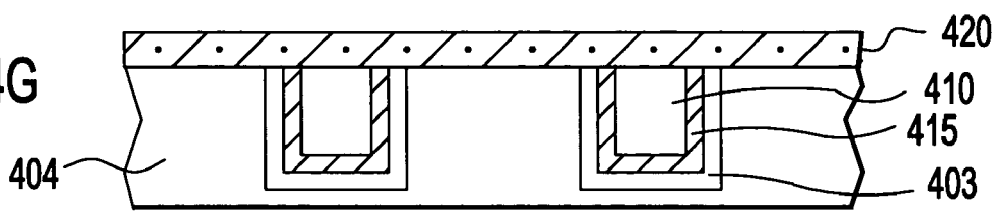

FIGS. 4A through 4K illustrate the structures obtained at each step of processing a carrier with through-vias in accordance with the process flow of FIG. 3 with further detail regarding the backside processing. Substrate 404 in FIG. 4A comprises the silicon substrate having etched blind vias. In FIG. 4B, the blind vias have been provided with an insulating layer 403, followed by the annular fill illustrated as 415 in FIG. 4C. The CTE-matched fill material 410 is then provided, overfilling the vias as shown in FIG. 4D. After planarization of the top surface, and any optional processing to fabricate IC devices or circuits on the top surface, the structure of FIG. 4E is then subjected to the grinding and polishing step at the bottom surface to remove the excess substrate material and bottom via fill materials (i.e., the insulating layer 403 and metal 415 which line the bottom of the blind vias) to expose the through vias as shown in FIG. 4F.

Figure 4H:
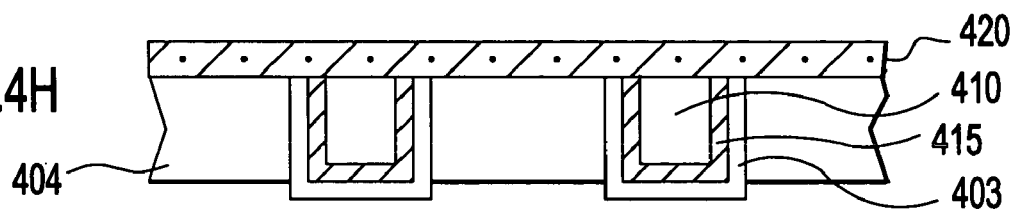
Figure 4I:
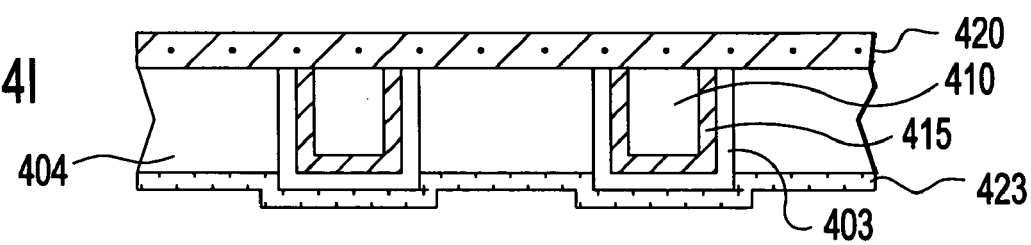
Figure 4J:
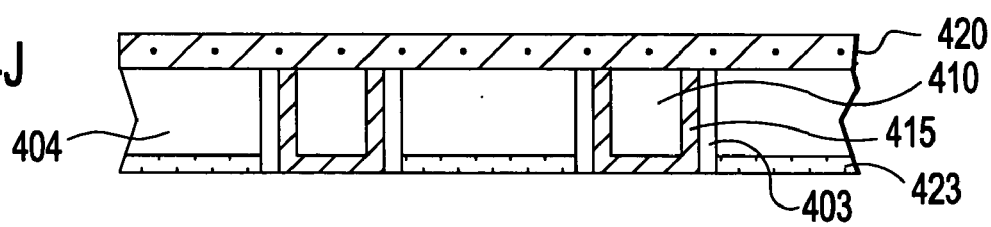
Figure 4K:
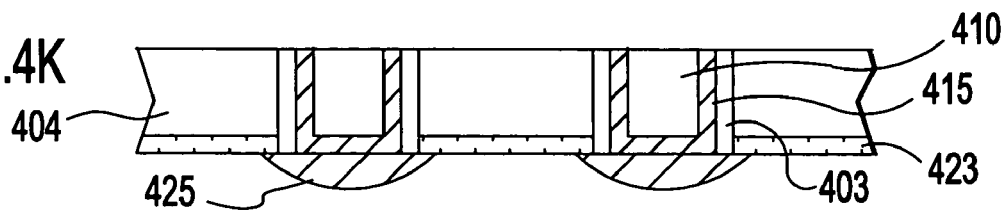

The backside grind and polish is preferably done to within 10-20 μm of the via bottoms, after which they are exposed by using a wet etch to recess the remaining silicon as shown in FIG. 4H. Care is taken to protect the frontside of the structure (wafer) from the wet etch chemistry. This can be done through a number of methods, representatively illustrated as layer 420 in FIG. 4G, including but not limited to a) a sacrificial protective coating such as a deposited oxide, nitride, or polyimide spin-on; b) a protective tape that is impervious to backside wet processing chemistry; or c) a fixture which creates a seal at the wafer edge and covers the frontside. The frontside protection is removed after all backside wet processing is complete. Wet etch of the silicon to reveal the vias can be done with etches such as potassium hydroxide (KOH) or tetramethylammonium hydroxide (TMAH). Concentrations of these chemistries can range from 10-50% by weight. The KOH or TMAH is typically heated to 50° C.-80° C. which results in faster etching of the silicon. A timed etch is used to etch the silicon and recess the surface below the via tops by 5-10 μm. After etching the carrier material as shown in FIG. 4H, a blanket layer 423 of oxide, or other insulating material such as polyimide, is deposited as shown in FIG. 4I. Any remaining oxide cap or oxide/nitride cap that surrounds the exposed via bottoms is briefly polished by CMP to expose the conductive material in the via cores as illustrated in 4J, while leaving the bulk of the thicker backside wafer insulation in place. The back surface of the silicon wafer is thus completely insulated except over the conductive through-vias, so that metal pads or C4s, 425, can be deposited over the via tips without shorting to the substrate as shown in FIG. 4K.

Figure 2B:
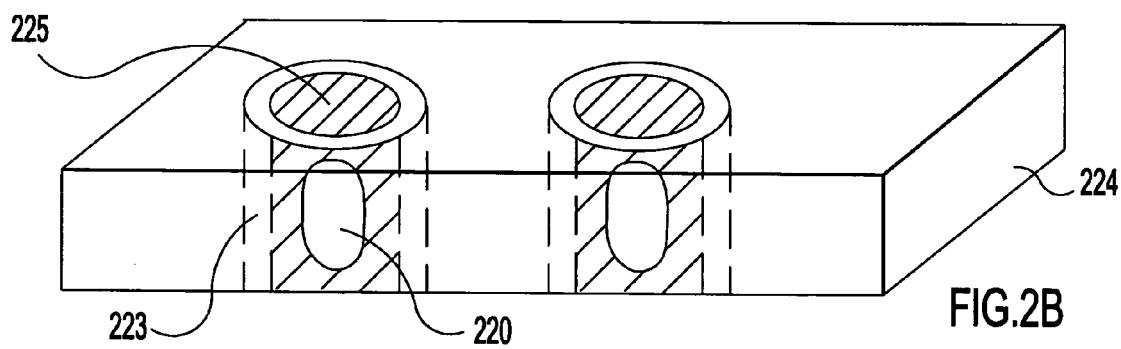

The structure of FIG. 2B comprises a substrate 224 in which the through-via comprises an annular ring of insulating material 223 within which is disposed a conductive via of metal (e.g., copper) 225 having a void 220 at its core. The top and bottom surfaces of the through-via are copper, and copper covers the insulated sidewalls of the through-via. However, a void filled with a gas such as air, an inert gas, or $N_2$, or alternatively a vacuum, is disposed at the center of the through-via and provides an effective modulus which is more nearly matched to the substrate 224. The through-via becomes compliant when voided, resulting in a lower effective modulus and a lower effective Poisson ratio, and therefore exhibiting lower stresses and forces due to surrounding structures. The effective Poisson ratio here is defined as the ratio of out-of-plane displacement to in-plane displacement due to in-plane stress to reduce mechanical stresses encountered in processing and use. For a through-via material with high Poisson ratio of 0.4, the effective Poisson ratio can be reduced to about 0.22 with the introduction of a percolated network of through-voids with an effective radius of three quarters of the through-via radius when a through-void of radius of three quarters of the via radius is introduced in the through-via. Although it does not change the thermal expansion coefficient, the introduction of a void or voids reduces the effective modulus and Poisson ratio of the through-via, resulting in a compliant through-via that exerts much less stress and force on the surrounding structures. In other words it behaves on a whole as if it had a much smaller thermal expansion mismatch with the substrate, thereby reducing piston-like deviations at the top during thermal cycling.

Figure 5:
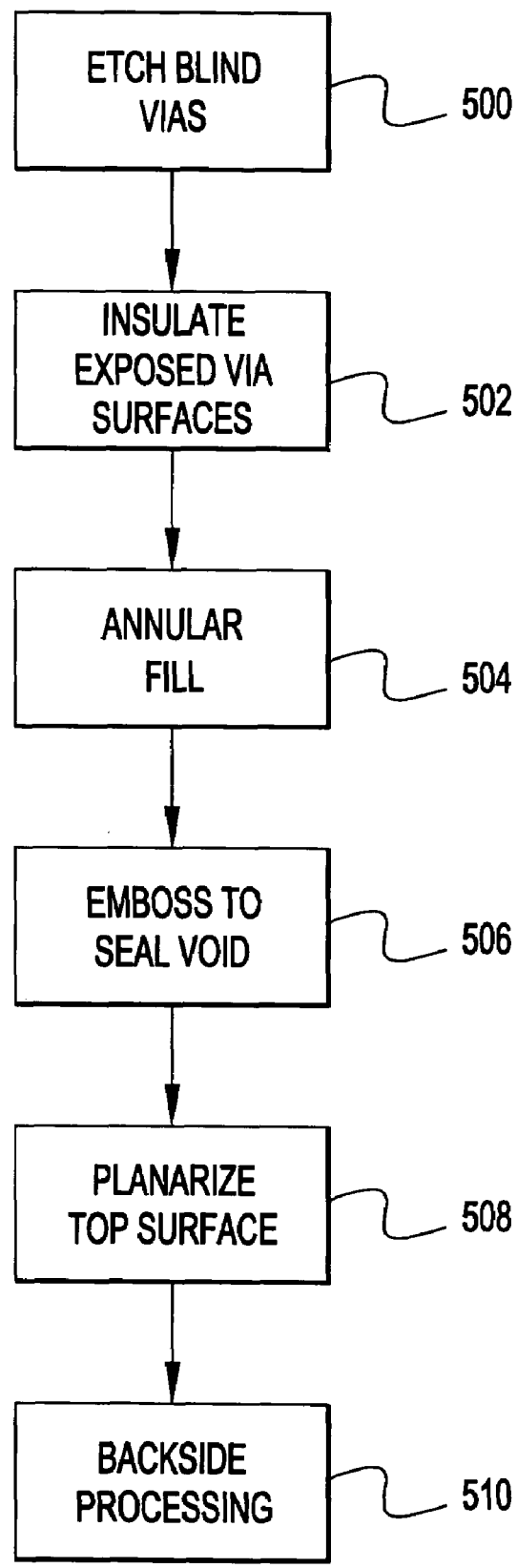
FIG. 5 is a flow chart of a representative process flow for fabricating a carrier with through-vias, as shown in FIG. 2B, in accordance with a second embodiment of the present invention.

FIG. 5 is a flow chart of a representative process flow for fabricating a carrier with through-vias, as shown in FIG. 2B, in accordance with a second embodiment of the present invention. At step 500, blind vias are etched into the substrate, as above, to a depth which is slightly greater than the desired depth of the through-vias in the finished product. At step 502, the sidewalls of the blind vias are insulated (as above), preferably by oxidizing silicon to form a thin layer of $SiO_2$ or PECVD oxide or nitride or both. An annular fill is conducted at step 504 for provide metal (e.g., PVD TaN/Ta/Cu plus plated Cu to thickness ~1/10 to ~1/5 of the via diameter) along the exposed insulated surfaces of the blind via. The top of the via is then capped with metal by either an overfilling, burnishing, or similar technique. The void in the center of the via will contain the ambient of the capping process, typically N2 or a vacuum. Overfilling is achieved by a PVD, CVD, evaporation, or sputtering process for metal deposition that will enclose and pinch off the via top. A polishing step may be needed to restore planarity. In the alternative, burnishing a conformally-plated blanket copper layer (which partially fills the through-via) with a blunt-tipped tool can also be used to smear the ductile copper from the wafer surface into and over the via hole, thus creating a sealed cavity within the via. The void will not introduce mechanical stress upon the substrate during subsequent processing or use. Thereafter, the top of the structure is planarized at step 508 to remove excess metal at the top surface and to expose the substrate between the vias. The planarization step must leave the top via surfaces of metal disposed in the top surface of the substrate material. Fabrication of IC circuits or components, etc. on the top surface may be done at some point, as above. Finally, at step 510, the bottom substrate surfaces are exposed to the backside processing steps to expose the blind vias and remove the excess substrate material and insulating layer and insulate the substrate bottom surface, as above. Care must be taken at both the top and bottom surfaces to leave metal across the entire via surface in order to preserve the void within.

Figure 6A:
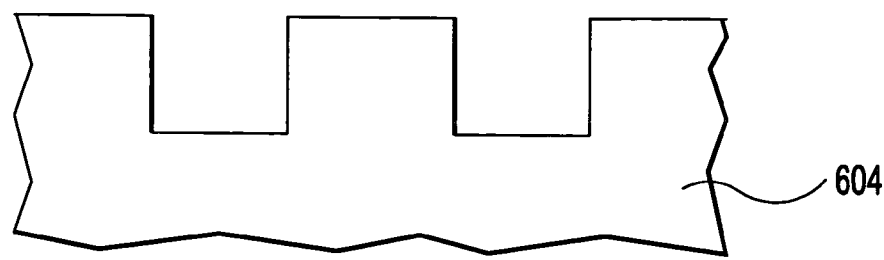
FIGS. 6A through 6F illustrate the structures obtained at each step of processing a carrier with through-vias in accordance with the process flow of FIG. 5.
Figure 6B:
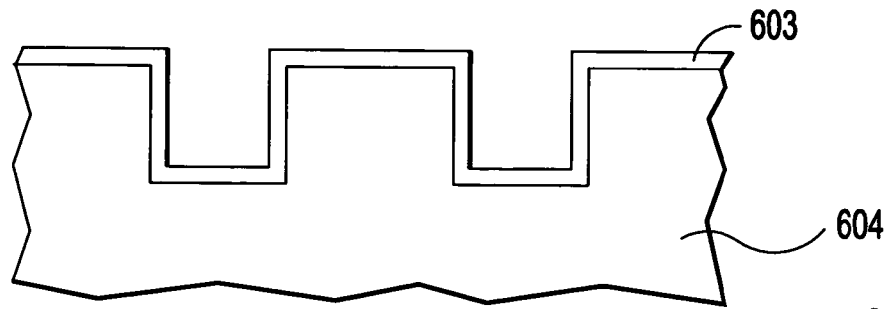
Figure 6C:
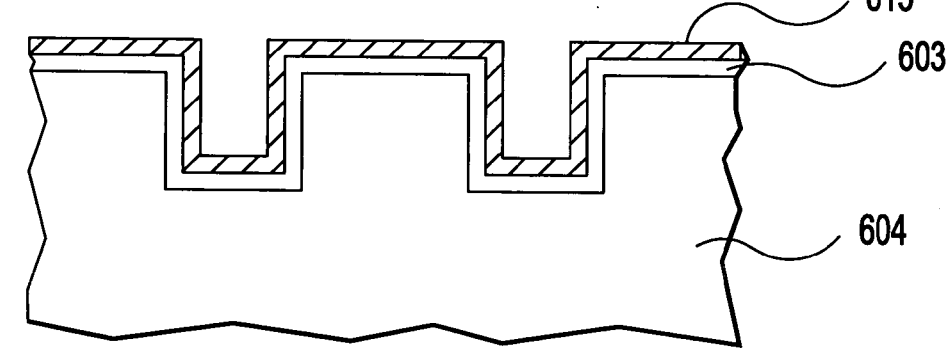
Figure 6D:
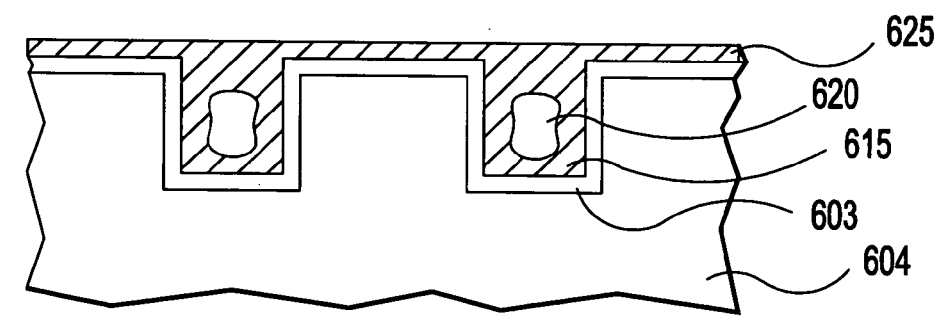
Figure 6E:
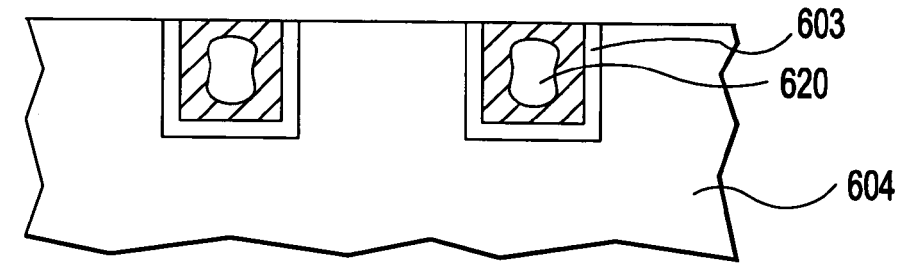
Figure 6F:
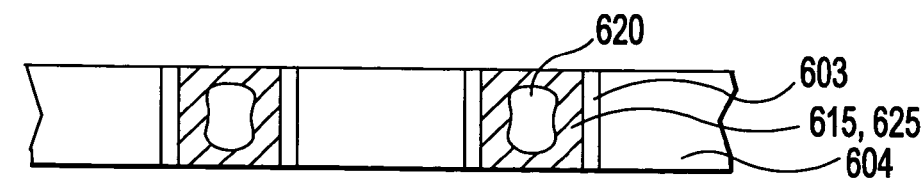

FIGS. 6A through 6F illustrate the structures obtained at each step of processing a carrier with through-vias in accordance with the process flow of FIG. 5. At FIG. 6A, the blind vias are etched in substrate 604. The insulating layer 603 is formed in the blind vias of the structure in FIG. 6B. Thereafter, the annular fill is conducted to provide metal 615 along the exposed insulated surfaces of the vias to yield the structure of FIG. 6C. The sealing or burnishing step provides additional metal 625 at the top surface of the vias, in conductive contact with the metal 65 and seals void 620 within, as shown in FIG. 6D. Planarization is done to remove the excess metal and expose the substrate 604 and metal vias at the top surface as shown in FIG. 6E. IC circuits or components may be fabricated on the top surface, as above. Finally, the bottom of the structure is exposed to the backside processing steps to remove the excess substrate material and insulating layer at the bottom of the vias, while leaving metal at the via bottom, as illustrated in FIG. 6F.

Figure 2C:
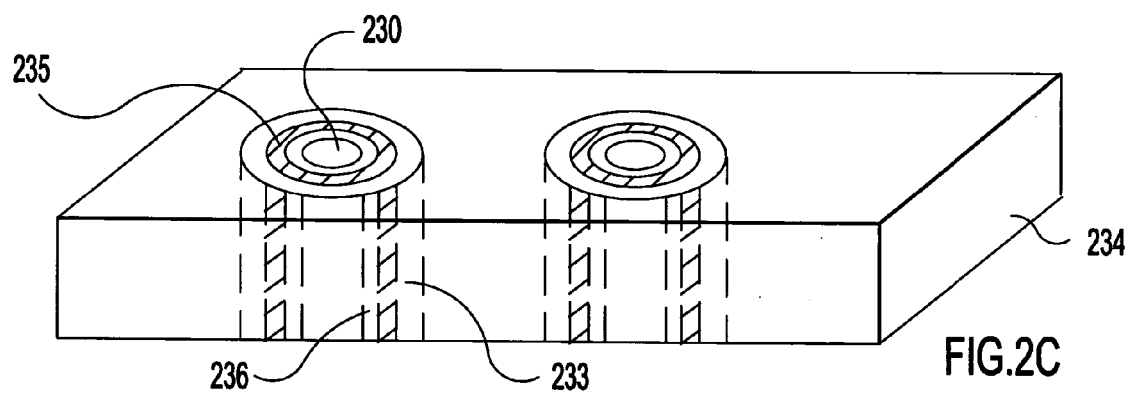

The structure of FIG. 2C comprises a substrate 234 in which the through-vias each comprise an annular ring of insulating material 233 within which is disposed concentric circles comprising conductive via metal (e.g., copper) 235, inner insulating ring 236, and a core post 230 of substrate material. This differs from the coaxial through-via of the aforementioned Gaul patent in that the center post here is an insulator or semiconductor and does not carry the electrical signal. The center post is not contacted by the IC circuitry on the top or on the bottom of the carrier. The post is effectively a hollow waveguide, and could even be used for optical conductance through the Si substrate. The inner core of substrate material will necessarily be a thermal and modulus match to the outer substrate material, thereby reducing the mechanical effects of the overall via structure on the substrate.

Figure 7:
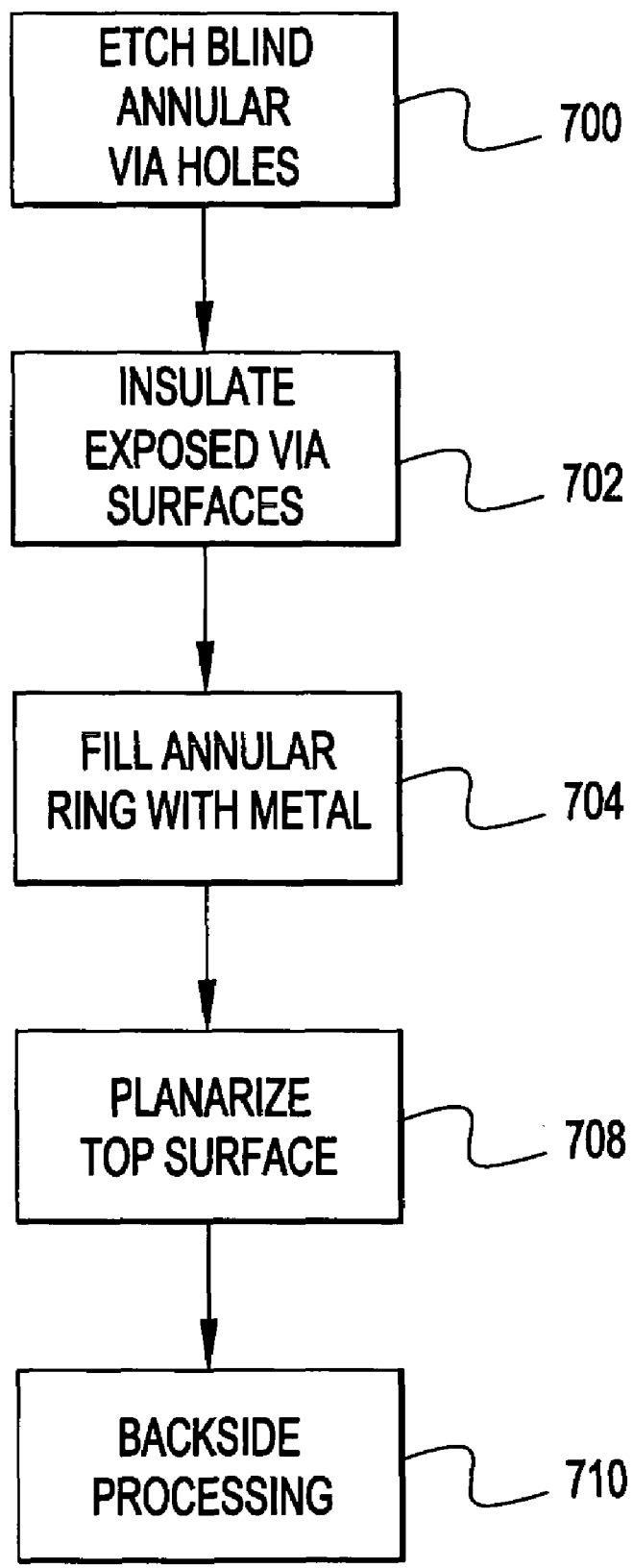
FIG. 7 is a flow chart of a representative process flow for fabricating a carrier with through-vias, as shown in FIG. 2C, in accordance with another embodiment of the present invention.
Figure 8A:
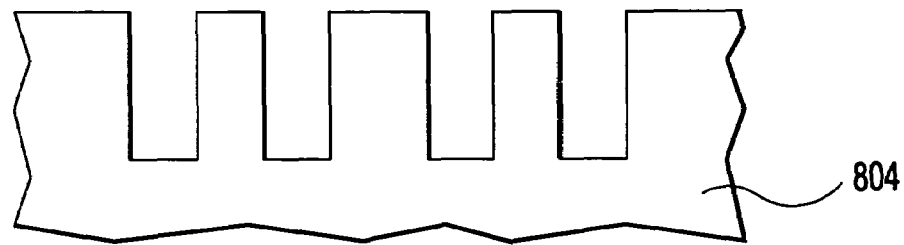
FIGS. 8A through 8E illustrate the structures obtained at each step of processing a carrier with through-vias in accordance with the process flow of FIG. 7.
Figure 8B:
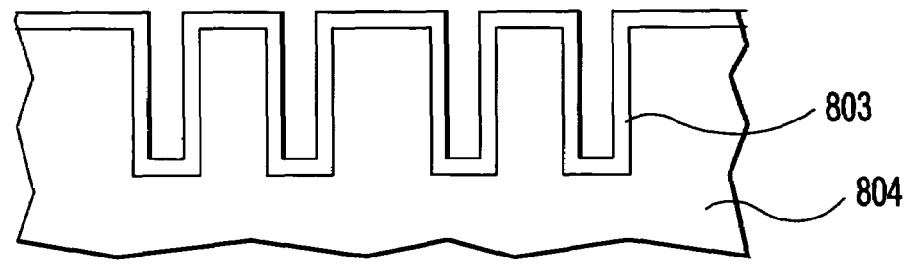
Figure 8C:
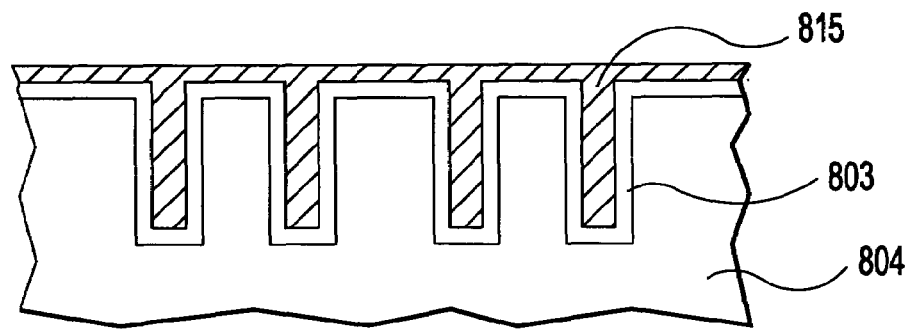
Figure 8D:
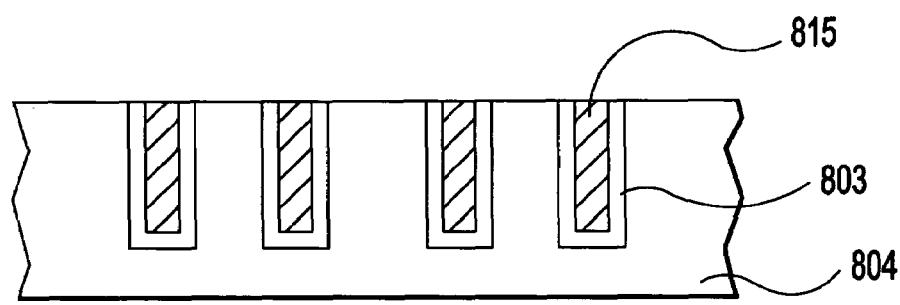
Figure 8E:
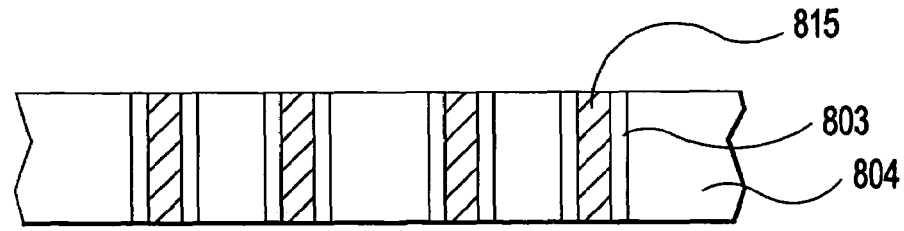

FIG. 7 is a flow chart of a representative process flow for fabricating a carrier with through-vias, as shown in FIG. 2C, in accordance with a third embodiment of the present invention. At step 700, blind vias are etched into the substrate to a depth which is the desired depth of the through-vias in the finished product. The vias are etched in a pattern whereby each is an annular via of thickness ~1/10 to ~1/5 of the via diameter etched about a post of substrate material which will remain as the core of the via. At step 702, the sidewalls of the blind vias are insulated, preferably by oxidizing silicon to form a thin layer of $SiO_2$ (see above) on both the outer sidewalls and the post sidewalls. The annular vias are then overfilled with the desired conductive material at step 704. Thereafter, the top of the structure is planarized at step 708 to remove excess metal at the top surface and to expose the substrate between the annular metal rings of the vias. IC circuits or components may be fabricated on top surface, as above. Finally, at step 710, the bottom substrate surfaces are exposed to the backside processing steps to expose the blind vias and remove the excess substrate material and insulating layer.

FIGS. 8A through 8E illustrate the structures obtained at each step of processing a carrier with through-vias in accordance with the process flow of FIG. 7. At FIG. 7A, the annular vias are etched in substrate 704. The insulating layer 703 is formed on the sidewalls of the annular vias of the structure in FIG. 7B. Thereafter, the annular fill is conducted to provide metal 715 along the exposed insulated surfaces of the vias to completely fill the vias and yield the structure of FIG. 7C. Planarization is done to remove the excess metal and expose the substrate 704 and annular metal vias at the top surface as shown in FIG. 7D. IC circuits or components may be built on top surface, as above, with care taken to contact the conductive annulus. Finally, the bottom of the structure is exposed to the backside processing steps to remove the excess substrate material and insulating layer at the bottom of the vias, as illustrated in FIG. 7E.

Figure 2D:
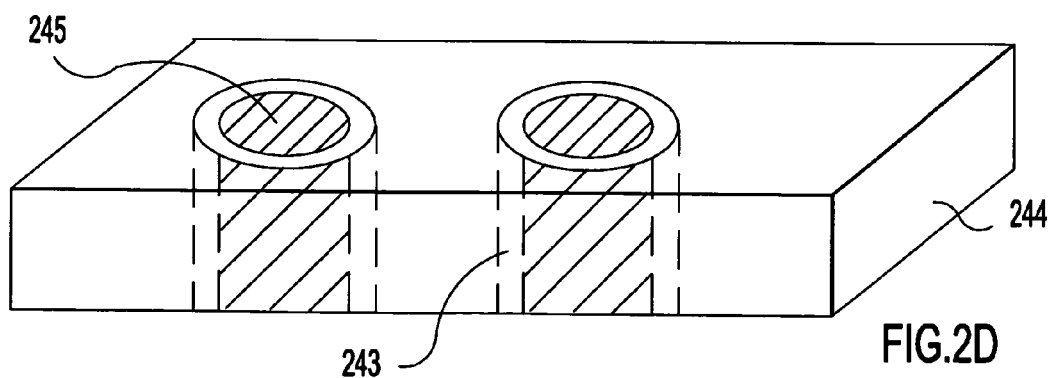

The structure of FIG. 2D comprises substrate 244 having vias of metal-ceramic core 245 surrounded by an annular insulating ring 243. The metal-ceramic is chosen to have a coefficient of thermal expansion which is closely matched to the CTE of the substrate material, as well as a modulus which is close to that of the substrate or which is less than that of the substrate, with enough porosity to decrease the effective modulus and Poisson ratio. Examples of suitable materials include a copper cordierite metal-ceramic, surrounded by an $SiO_2$ or $SiO_2/Si_3N_4$ insulating layer in a silicon substrate. Additional materials of interest would be other low CTE materials, such as, but not limited to, glass ceramic, beta-Eucryptite, Enstatite, Fosterite, millite, Zircon, and fused silica. Metals in addition to copper, such as gold and silver, would be suitable candidate conductors due to their excellent conductivities. Additionally, alloys of the above metals as well as solid solution alloys such as Cu—Ni are of interest.

Another example of a suitable fill material consists of fine particles of a low-CTE core material coated with a thin layer of linking metal such as copper. The low CTE core can consist of a wide range of materials from low CTE metals or alloys such as molybdenum, tungsten or Invar to nonmetals such as SiO2, silicon and silicon carbide. The coating material must consist of a metal for electrical conductivity, and should be able to form metallurgical joins at temperatures compatible with other structures already built on the wafer. Copper is a particularly desirable material because it is highly conducting and can form joins by Cu surface diffusion at temperatures considerably below its melting point. Other metals or alloys are also suitable such as thin layers of solder.

Further, heterogeneous mixtures of particles with the same outer layer (joining metal) but with different cores, could be utilized to advantage. For instance a mixture of copper coated tungsten (Cu/W) could be mixed with copper coated SiO2 (Cu/SiO2). The combination would lower the average CTE compared to Cu/W alone (which is already low CTE relative to Cu alone) while maintaining enough Cu/W to ensure outstanding electrical conductivity as well as ensuring mechanical and electrical connectivity between all outer shells. In addition there may be advantages in some cases to mixing particles with dissimilar outer layers. For instance, two particle types could be coated with metals A and B, where a low melting AB eutectic could form upon contact and mild heating.

Calculations suggest that a greater than 2000 Angstrom coating is desirable for high electrical conductivity if the outer layer alone were the only contributor to conductivity as would be the case of Cu coated SiO2. For particles with conducting cores, the thickness of the Cu outer layer should be as thin as possible to keep the net CTE low while maintaining good joining characteristics.

Figure 9:
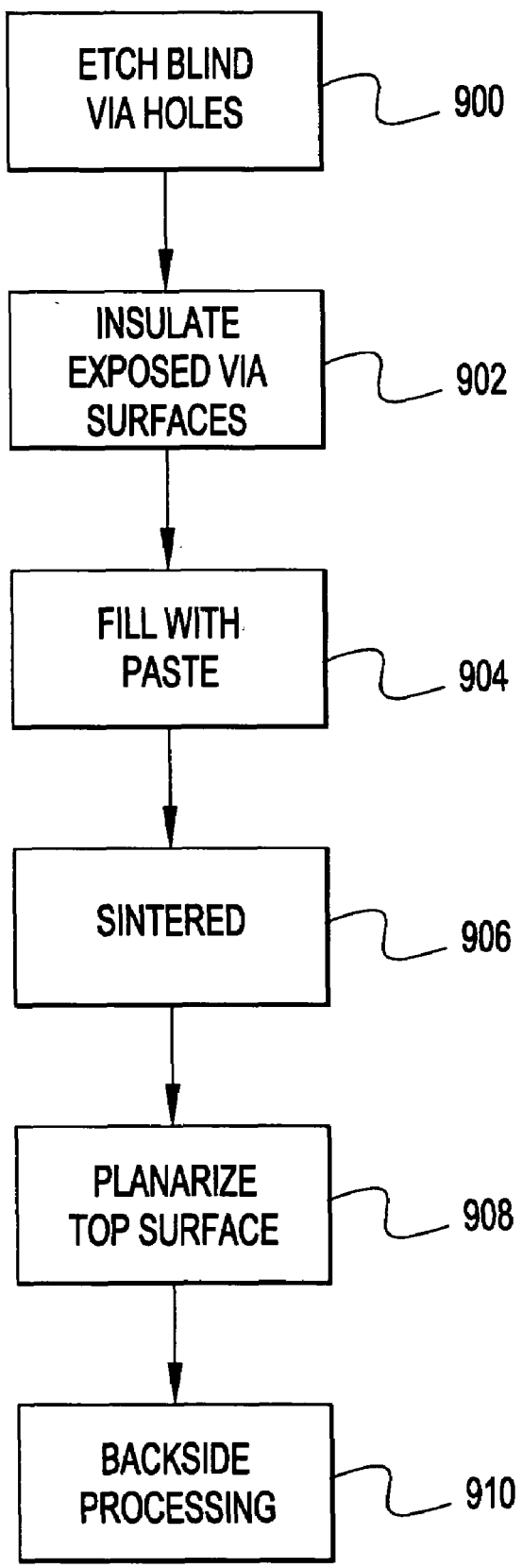
FIG. 9 is a flow chart of a representative process flow for fabricating a carrier with through-vias, as shown in FIG. 2D, in accordance with another embodiment of the present invention.

FIG. 9 is a representative flow chart for fabricating the structure of FIG. 2D. At step 900 the blind vias are etched into the substrate. At step 902, an insulating layer is formed along the exposed surfaces of the blind vias, typically by exposing the structure to an oxidizing atmosphere or PECVD, etc. as above. Thereafter, the remaining via volume is filled with the metal-ceramic. As illustrated, a metal-ceramic paste may be spread in the insulated vias at step 904, followed by a sintering step to cure the via fill. To remove excess paste overburden and particle residue a four stage cleaning method was developed including a first rinse step, a first coarse wiping step, a second fine wiping step, and a spin dry step. Details of an apparatus and method for applying paste into blind vias in a wafer are described in a separate patent application, Ser. No. 10/700,327, entitled "Method and Apparatus for Filling Vias", (YOR920030196US1), which was filed on Nov. 3, 2003, the teachings of which are herein incorporated by reference. A low-temperature bake (between 100° C. and 200° C.) in nitrogen or an inert ambient or vacuum may be used to drive off volatile components in the paste before high temperature sintering begins. This low temperature step may be tailored to allow controlled shrinkage of the paste compound, thus affording the possibility of using multiple filling steps to achieve a precise level of fill or a controlled recess. Multi-step sintering between 400° C. and about 900° C. can be used in a variety of ambients (including nitrogen or steam ending with forming gas) to achieve complete burnout of any organic components at lower temperatures, and to achieve complete reduction of any oxide and good linking of metal particles at higher temperatures. This will result is a connected network of metal particles within a porous cordierite/glass phase. Planarization at step 908 will remove any excess conductive material from the backside processing at step 910 will expose the through-vias.

Figure 10A:
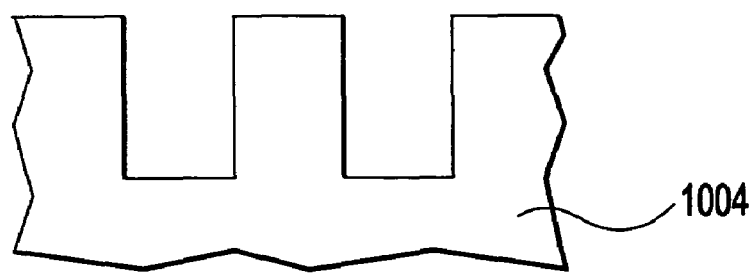
FIGS. 10A through 10E illustrate the structures obtained at each step of processing a carrier with through-vias in accordance with the process flow of FIG. 9.
Figure 10B:
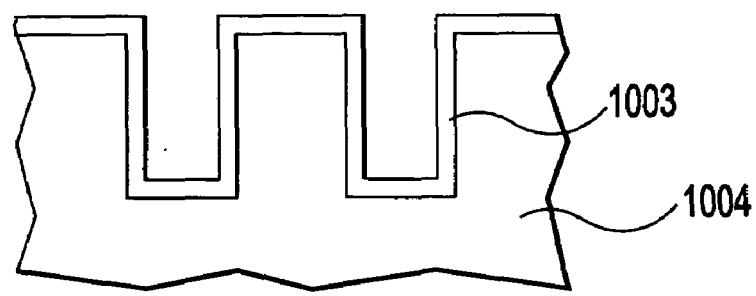
Figure 10C:
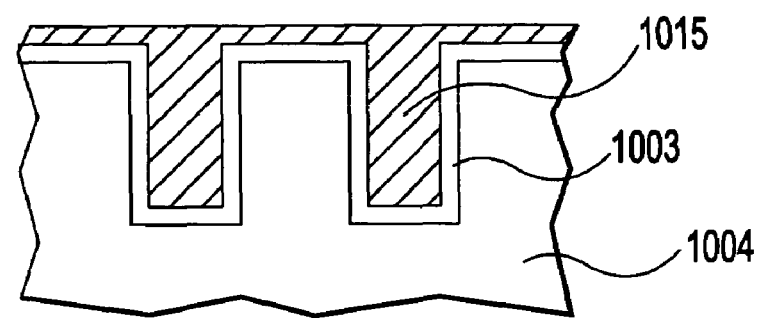
Figure 10D:
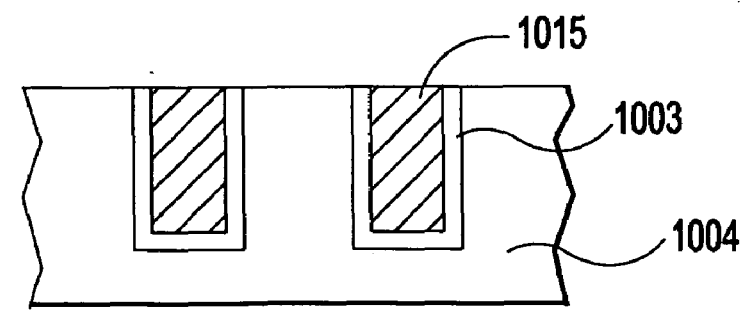
Figure 10E:
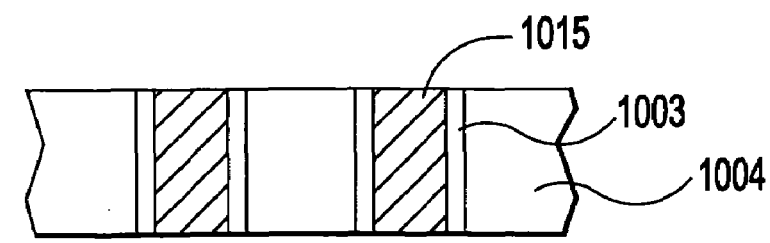

FIGS. 10A through 10E illustrate the structures obtained at each step of processing a carrier with through-vias in accordance with the process flow of FIG. 9. At FIG. 10A, the vias are etched in substrate 1004. The insulating layer 1003 is formed on the sidewalls of the vias of the structure in FIG. 10B. Thereafter, the fill is conducted to provide metal-ceramic 1015 along the exposed insulated surfaces of the vias to completely fill the vias and yield the structure of FIG. 10C. Planarization is done to remove the excess metal and expose the substrate 1004 and metal vias at the top surface as shown in FIG. 10D. IC circuits or components may be added as above. Special care must be taken to make electrical contact the top surface of the metal-ceramic filled through-vias.

Finally, the bottom of the structure is exposed to grinding and polishing and etching to remove the excess substrate material and then adding an insulating layer to the exposed silicon substrate and subsequently removing the insulator only over the raised via bottoms by selective polishing, as illustrated in FIG. 9E.

Figure 11A:
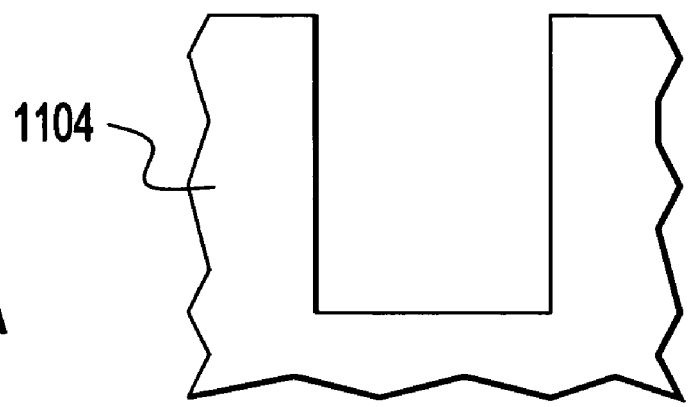
FIGS. 11A through 11C illustrate the formation of a collar about the top opening of the through-via to facilitate optimal electrical contact.
Figure 11B:
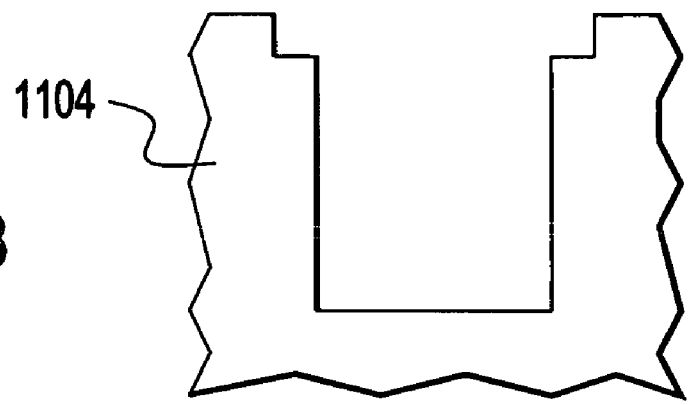
Figure 11C:
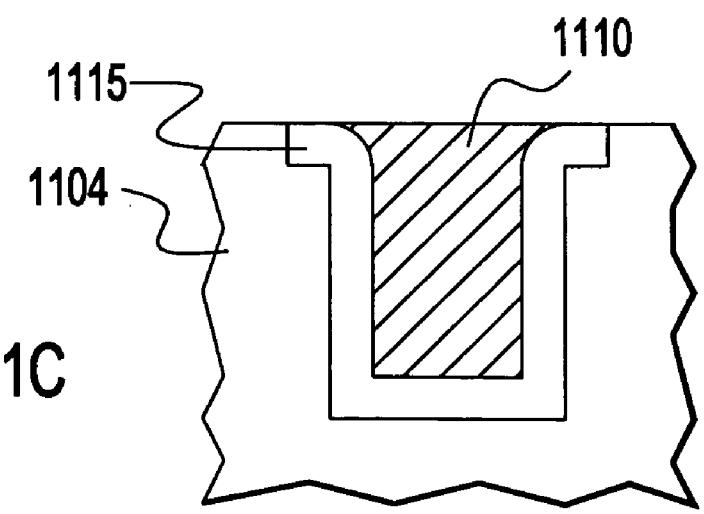

An effective method for ensuring good electrical contact to the surface of a partially plated through-via is to etch a shallow, concentric collar of suitably larger diameter around the top of the through-vias as shown in FIGS. 1A-11C. Such a structure adds a mask step, but greatly enhances the chances of achieving a good contact to subsequent levels of wiring as long as the collar depth is set to be no greater than the sidewall plating thickness. During final planarization, the collar effectively extends the annulus 1115 of FIG. 11C outward, offering a larger capture surface on which to drop contact vias, while moving these contacts further away from the central area of the deep via where filling is most challenging.

The fill material and processing described above may be tailored to leave the filled vias with an intentionally porous internal structure and/or with a controlled recess between the surface of the fill material and the top of the via. An intentionally porous and/or recessed surface must be effectively capped and sealed before the via planarization step to enable subsequent processing of the substrate. A number of metals and deposition methods can be used to seal effectively seal and cap such vias, including but not limited to tungsten, tantalum, or copper. Deposition methods may include sputtering, plasma jet deposition, thermal or laser-assisted CVD, molten liquid, metal infiltration via capillary action, or bumping with solder. Cap thickness may vary between about 0.5 to 10 microns depending on the size of the surface pores and/or the depth of the recess. In the case of sputtered or jet-deposited copper, it is particularly useful to post-anneal the metal at a temperature above 500C. to assure good pore-sealing prior to final planarization. This anneal can be achieved using standard oven or hot plate anneals or using laser assisted localized heating of the cap metal.

An alternative approach for metal capping of the filled porous via is the use of insulators. This is particularly practical with the partially plated vias where the electrical connection through the carrier is not counting on the via fill. Thus any number of high temperature (>or ~400C.) stable insulating materials including but not limited to silicon dioxide, silicon nitride, silicon oxynitride, ceramics or high temperature polymers can be used. The inorganic material may be deposited using thermally activated or plasma-enhanced CVD, sputtering, or other such techniques known in the microelectronics field as well as plasma jet deposition. Co-Pending patent application Ser. No. _____, filed Oct. 17, 2003, entitled "Silicon Chip Carrier with Through-Vias Using Laser Assisted CVD of Conductor", provides deposition teachings, which are herein incorporated by reference. Photolithography may be used to remove insulator from the field areas, leaving it only on the via surface to seal pores and/or fill any recess. Final surface planarization after capping is done using CMP to expose the partially plated via sidewall top surface, or planarizing to the level of desired insulator thickness for electrical connection of the overlying build to the deep via.

Figure 12A:
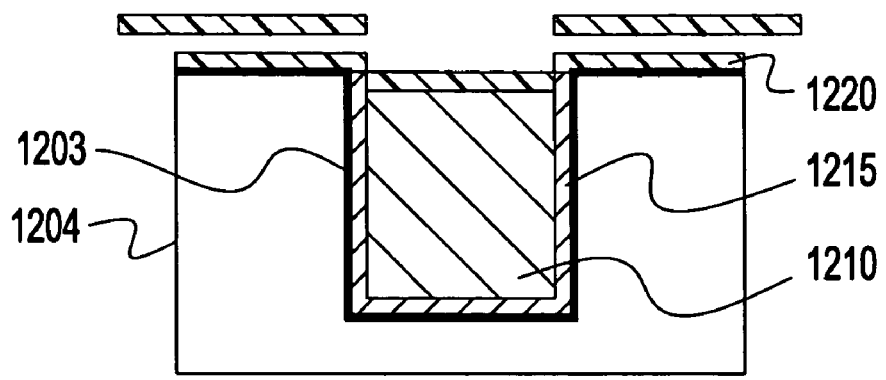
FIGS. 12A through 12C illustrate steps and the resulting structures for capping the through-vias.
Figure 12B:
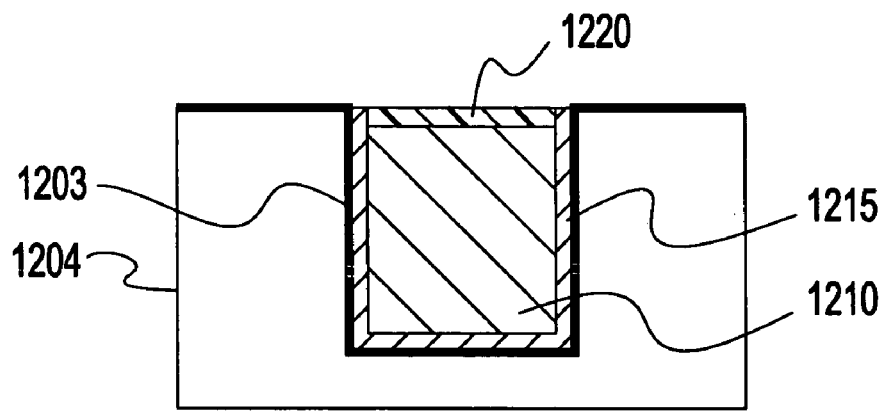
Figure 12C:
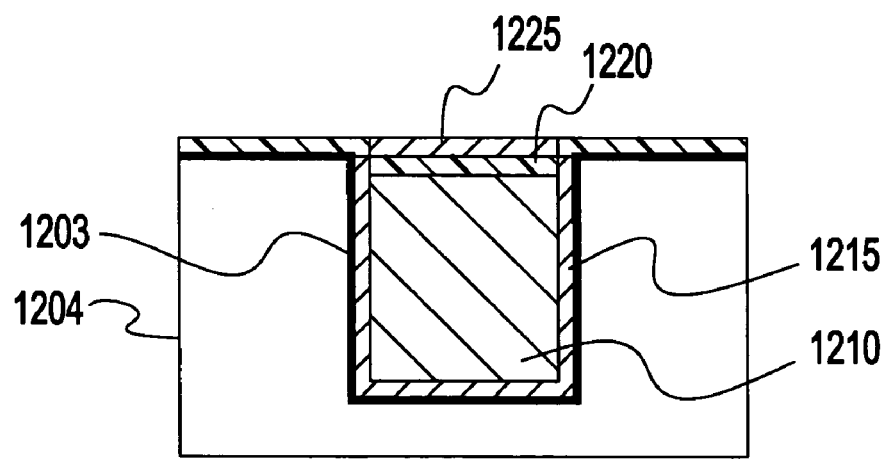

High temperature polymers, including but not limited to polyimides or photosensitive polyimides (PSPI), may be spin applied from solution, laminated, or vapor deposited onto the surface of the substrate 1204, as shown at 1220 of FIGS. 12A-12C, having through-vias including insulative via liner 1203, conducting material 1215, and via fill 1210. With appropriate viscosity and surface tension properties the liquid polyimide precursor may not significantly penetrate into the porous via, thus largely preserving the thermal properties of said via. To aid in the removal of the excess polymer in the field area, the negatively or positively working PSPI is exposed and developed to remove the unwanted material, FIG. 12B. A touch-up polish can be applied to improve further the planarity of the surface. The electrical connection after insulator capping is done at the partially plated via sidewalls, or a conductive cap, shown as 1225 in FIG. 12C, can be deposited to connect electrically the via sidewalls.

All of the embodiments of the present invention provide conductive through-vias having effective CTEs and modulus values which are more closely matched to the CTE and modulus of the substrate materials than pure metal or metal compound vias. As well some have reduced Poisson ratios. Optimally, the finished supporting substrate has a thickness of 300 μm, with via aspect ratios of less than or equal to 4:1, such that the through-via diameter must be greater than or about equal to 75 μm. While the invention has been described with reference to several preferred embodiments, it should be understood that modifications can be made without departing from the spirit and scope of the invention as set forth in the appended claims.

The invention claimed is:

1. A semiconductor carrier structure for mounting semiconductor chips comprising:
   a semiconductor substrate comprising a substrate material having a first coefficient of thermal expansion and a first elastic modulus;
   at least one constant diameter through-via in said semiconductor substrate, wherein each of said through-vias is filled with a conductive structure having a second coefficient of thermal expansion which is less than or substantially the same as the first coefficient of thermal expansion and a second elastic modulus which is less than or equal to the first elastic modulus, wherein said each conductive structure comprises a first conductive via material disposed in annular shape along the sidewalls of said through-via, said annular shape having an annular diameter which is said constant diameter and having a core structure comprising a second via material disposed within said annular shape and having a core diameter which is less than said constant diameter.

2. The semiconductor carrier structure of claim 1 wherein said second via material comprises an insulating material.

3. The semiconductor carrier structure of claim 1 wherein said second via material comprises a conducting material.

4. The semiconductor carrier structure of claim 1 wherein said second via material comprises said substrate material.

5. The semiconductor carrier structure of claim 1 wherein said second via material is selected from the group consisting of polyimide, thermid, KJ, photosensitive polyimide, SiLK, or other high-temperature polymer.

6. The semiconductor carrier structure of claim 1 wherein said second via material comprises a material having a third coefficient of thermal expansion which is less than or about equal to said first coefficient of thermal expansion.

7. The semiconductor carrier structure of claim 1 wherein said second via material comprises silicate glass.

8. The semiconductor carrier structure of claim 1 wherein said second via material comprises of silica or a silicate glass-filled high temperature polymer.

* * * * *